(12) United States Patent
Yamanouchi (10) Patent No.: US 6,791,237 B2
(45) Date of Patent: Sep. 14, 2004

(54) SURFACE ACOUSTIC WAVE SUBSTRATE AND SURFACE ACOUSTIC WAVE FUNCTIONAL ELEMENT

(76) Inventor: Kazuhiko Yamanouchi, 37-13, Matsugaoka, Taihaku-ku, Sendai-shi, Miyagi (JP)

( * ) Notice: Subject to any disclaimer, the term of this patent is extended or adjusted under 35 U.S.C. 154(b) by 227 days.

(21) Appl. No.: 10/085,943

(22) Filed: Feb. 28, 2002

(65) Prior Publication Data

US 2002/0140316 A1 Oct. 3, 2002

(30) Foreign Application Priority Data

Mar. 4, 2001 (JP) ........................................ 2001-110641
Nov. 6, 2001 (JP) ........................................ 2001-379311

(51) Int. Cl.$^7$ ............................................. H01L 41/08
(52) U.S. Cl. ............................... 310/313 R; 310/313 A
(58) Field of Search ......................... 310/313 R, 313 A, 310/313 B, 313 D (56) References Cited

U.S. PATENT DOCUMENTS

| | | | | |
|---|---|---|---|---|
| 4,484,098 A | * | 11/1984 | Cullen et al. | 310/313 B |
| 4,544,857 A | * | 10/1985 | Shimizu et al. | 310/313 B |
| 5,432,392 A | * | 7/1995 | Kadota et al. | 310/313 A |
| 5,844,453 A | | 12/1998 | Matsui et al. | 333/193 |
| 5,894,251 A | | 4/1999 | Taguchi et al. | 333/193 |
| 6,310,425 B1 | * | 10/2001 | Tanaka | 310/313 R |
| 6,426,584 B2 | * | 7/2002 | Yoshida et al. | 310/313 A |

FOREIGN PATENT DOCUMENTS

| | | |
|---|---|---|
| JP | 63-260213 | 10/1988 |
| JP | 7-15274 | 1/1995 |

OTHER PUBLICATIONS

Patent Abstracts of Japan, Publication No. 07–015274, Publication Date Jan. 17, 1995, 2 pages.

Patent Abstracts of Japan, Publication No. 63–260213, Publication Date Oct. 27, 1988, 2 pages.

"Temperature Dependence of Rayleigh Waves and Piezoelectric Leaky Surface Waves in Rotated Y–Cut LiTaO3 and SiO2/LiTaO3 Structures"; authors Kazuhiko Yamanouchi, Kohji Iwahashi and Kimio Shibayama of the Research Institute of Electrical Communication, Tohoku University, Sendai 980 (Japan), (received Jul. 15, 1978, accepted in revised form Nov. 20, 1978), as published in Wave Electronics, 3 (1979) 319–333; Elsevier Scientific Publishing Company, Amsterdam (15 pages).

"SAW Properties of SiO2/128° Y–X LiNbO3 Structure Fabricated by Magnetron Sputtering Technique"; authors Kazuhiko Yamanouchi (member IEEE), and Satoshi Hayama; as published in IEEE Transactions on Sonics and Ultrasonics, vol. SU–31, No. 1, Jan. 1984 (7 pages).

(List continued on next page.)

Primary Examiner—Mark Budd
(74) Attorney, Agent, or Firm—Osha & May L.L.P.

(57) ABSTRACT

Disclosed is a surface acoustic wave substrate including: a piezoelectric or electrostrictive substrate having large electromechanical coupling coefficient; and a thin film formed on the substrate and having variation characteristics of frequency of a surface acoustic wave relative temperature variation opposite to that of the substrate. The substrate is a LiNbO$_3$ substrate having a cut angle of rotated Y plate within a range from –10° to +30° and propagating a piezoelectric leaky surface wave having a propagation velocity higher than that of a Rayleigh type surface acoustic wave along X-axis direction or within a range of ±5° with respect to X-axis direction. A value of H/λ falls within a range from 0.05 to 0.35, where H is the film thickness of the thin film, and λ is the wavelength of operating center frequency of the piezoelectric leaky surface wave.

19 Claims, 7 Drawing Sheets

OTHER PUBLICATIONS

"Propagation and Amplification of Rayleigh Waves and Piezoelectric Leaky Surface Waves in LiNbO3", authors Kazuhiko Yamanouchi and Kimio Shibayama of the Research Institute of Electrical Communications, Toboku University Sendai, Japan (received Aug. 19, 1971) as published in Journal of Applied Physics, vol. 43, No. 3, Mar. 1972 (7 pages).

"Temperature Dependence of the Elastic, Piezoelectric, and Dielectric Constraints of Lithium Tantalate and Lithium Niobate", authors R.T. Smith and F.S. Welsh of Bell Telephone Laboratories, Incorporated, Allentown Pennsylvania 18103 (received Aug. 10, 1970) as published in Journal of Applied Physics, vol. 42, No. 6, May 1971.

"Determination of Elastic and Piezoelectric Constants for Crystals in Class (3m)", authors A.W. Warner, M. Onoe, and G.A. Coquin of Bell Telephone Laboratories, Incorporated, Murray Hill NJ 07971 as published in The Journal of the Acoustical Societyof America 1968 (received Oct. 20, 1966) (9 pages).

"Measurement of Elastic Constants at Low Temperatures by Means of Ultrasonic Waves–Data for Silicon and Germanium Single Crystals, and for Fused Silica", author H.J. MeSkimin of Bell Telelphone Laboratories, Murray Hill NJ (received Jan. 13, 1953) as published in Journal of Applied Physics, vol. 24, No. 8, Aug. 1953 (10 pages).

* cited by examiner

SURFACE ACOUSTIC WAVE SUBSTRATE AND SURFACE ACOUSTIC WAVE FUNCTIONAL ELEMENT

BACKGROUND OF THE INVENTION

1. Field of the Invention

The present invention relates to a surface acoustic wave substrate having a $LiNbO_3$ substrate propagating piezoelectric leaky surface wave along an X-axis direction on a cut plane of a rotated Y plate, and a thin film of $SiO_2$ or the like formed on the cut plane. More particularly, the invention relates to a surface acoustic wave substrate and a surface acoustic wave functional element having superior temperature characteristics.

2. Description of the Related Art

A surface acoustic wave functional element provided with an interdigital electrode on a surface of a piezoelectric substrate, has been widely used for a filter of an intermediate frequency band of a television set, a filter of a mobile communication equipment and so forth. The surface acoustic wave functional element has an electrode for exciting a surface acoustic wave and an electrode for receiving the surface acoustic wave on a surface of a substrate having piezoelectric function.

As a piezoelectric substrate to be used for the surface acoustic wave functional element in the prior art, a material having large electromechanical coupling coefficient $k^2$ has been used. However, the surface acoustic wave functional element using the substrate made of material having large electromechanical coupling coefficient $k^2$ generally has bad temperature characteristics and thus encounters a problem of lacking of temperature stability.

On the other hand, the surface acoustic wave functional element employing a monocrystalline piezoelectric substrate, such as ST-cut quartz, LST-cut quartz and so forth, demonstrates superior temperature stability, but has small electromechanical coupling coefficient $k^2$. Therefore, when it is used as the filter, insertion loss becomes large. Also, such surface acoustic wave functional element cannot be used for a filter having wide band width.

Therefore, there have been devised a $SiO_2/LiNbO_3$ substrate and a $SiO_2/LiTaO_3$ substrate, which are fabricated by using a $LiNbO_3$ substrate and a $LiTaO_3$ substrate as the substrates having superior temperature stability and large electromechanical coupling coefficient $k^2$, and depositing thereon $SiO_2$ films having small linear expansion coefficient and opposite temperature characteristics, respectively. Effectiveness of such $SiO_2/LiNbO_3$ substrate and $SiO_2/LiTaO_3$ substrate has been discussed in Yamanouchi, Iwahashi and Shibayama, "Temperature Dependence of Rayleigh Waves and Piezoelectric Leaky Surface Waves in Rotated Y-Cut $LiTaO_3$ and $SiO_2/LiTaO_3$ Structures" Wave Electronics, Vol. 3, December, 1979, or Yamanouchi and Hayama, "SAW Properties of $SiO_2$/128° Y-X $LiNbO_3$ Structure Fabricated by Magnetron Sputtering Technique", IEEE Transactions on Sonics and Ultrasonics, Vol. SU-31, No. 1, January, 1984. These substrates are recommended to apply as high stability oscillator and filters using normally bi-directional interdigital electrode.

However, substrate having further greater electromechanical coupling coefficient $k^2$ than the conventional substrate and having superior temperature stability has been required.

SUMMARY OF THE INVENTION

The present invention has been worked out in view of the shortcomings in the prior art. Therefore, it is an object of the present invention to provide a surface acoustic wave substrate and a surf ace acoustic wave functional element having an electromechanical coupling coefficient $k^2$ greater than the prior art and good temperature characteristics.

According to a first aspect of the present invention, there is provided a surf ace acoustic wave substrate comprising:

a piezoelectric or electrostrictive substrate having large electromechanical coupling coefficient; and a thin film formed on the substrate and having variation characteristics of frequency of a surface acoustic wave relative temperature variation opposite to that of the substrate, wherein the substrate is a $LiNbO_3$ substrate having a cut angle of rotated Y plate within a range greater than or equal to $-10°$ and smaller than or equal to $+30°$ and propagating a piezoelectric leaky surface wave having a propagation velocity higher than that of a Rayleigh type surface acoustic wave along X-axis direction or within a range of $\pm 5°$ with respect to X-axis direction, and a value of $H/\lambda$ falls within a range from 0.05 to 0.35, where H is the film thickness of the thin film, and $\lambda$ is the wavelength of operating center frequency of the piezoelectric leaky surface wave.

It is preferred that the cut angle of rotated Y plate of the substrate is in a range greater than or equal to $0°$ and smaller than or equal to $+20°$, and the value of $H/\lambda$ falls within a range from 0.1 to 0.35. In the alternative, it is preferred that the cut angle of rotated Y plate of the substrate is in a range greater than or equal to $+20°$ and smaller than or equal to $+30°$, and the value of $H/\lambda$ falls within a range from 0.15 to 0.35. By selecting the cut angle of rotated Y plate and $H/\lambda$ within the foregoing ranges, the temperature coefficient of frequency (TCF) as measured at $25°$ C. can be zero or quite small.

In the surface acoustic wave substrate of the invention, preferably, the temperature coefficient of frequency (TCF) as measured at $25°$ C. is in a range from $-30$ ppm/° C. to $+30$ ppm/° C. In addition, it is preferred that the electromechanical coupling coefficient $k^2$ of the piezoelectric leaky surface wave is greater than or equal to 0.155 and the electromechanical coupling coefficient $k_R^2$ of a Rayleigh wave component is smaller than or equal to 0.01.

The ranges of the temperature coefficient of frequency (TCF) and the electromechanical coupling coefficient $k^2$ may be achieved by selecting the cut angle of rotated Y plate and $H/\lambda$ within a range set forth in any of the following (1) to (5):

(1) the cut angle of rotated Y plate of the substrate is in a range greater than or equal to $-10°$ and smaller than or equal to $-5°$, and the value of $H/\lambda$ falls within a range from 0.07 to 0.31;

(2) the cut angle of rotated Y plate of the substrate is in a range greater than or equal to $-5°$ and smaller than or equal to $+10°$, and the value of $H/\lambda$ falls within a range from 0.115 to 0.31;

(3) the cut angle of rotated Y plate of the substrate is in a range greater than or equal to $+10°$ and smaller than or equal to $+15°$, and the value of $H/\lambda$ falls within a range from 0.16 to 0.31;

(4) the cut angle of rotated Y plate of the substrate is in a range greater than or equal to $+15°$ and smaller than or equal to $+20°$, and the value of $H/\lambda$ falls within a range from 0.2 to 0.31; and (5) the cut angle of rotated Y plate of the substrate is in a range greater than or equal to $+20°$ and smaller than or equal to +30°, and the value of H/λ falls within a range from 0.25 to 0.31.

According to a second aspect of the present invention, there is provided a surface acoustic wave functional element comprising a surface acoustic wave substrate as set forth above, the element including:

an exciting or receiving region having an interdigital electrode for exciting or receiving the piezoelectric leaky surface wave formed at an interface between the surface of the substrate and the thin film; and a propagating region having a structure for electrically shorting between the substrate and the thin film or a shorting type grating electrode structure formed at an interface between the surface of the substrate and the thin film.

According to a third aspect of the present invention, there is provided a surface acoustic wave functional element comprising a substrate including: a piezoelectric or electrostrictive substrate having large electromechanical coupling coefficient; and a thin film formed on the substrate and having variation characteristics of frequency of a surface acoustic wave relative temperature variation opposite to that of the substrate, wherein the substrate is a $LiNbO_3$ substrate having a cut angle of rotated Y plate within a range greater than or equal to −10° and smaller than or equal to +30° and propagating a piezoelectric leaky surface wave having a propagation velocity higher than that of a Rayleigh type surface acoustic wave along X-axis direction or within a range of ±5° with respect to X-axis direction, and a value of H/λ falls within a range from 0 to 0.35 in an exciting or receiving region, and within a range from 0.05 to 0.35 in a propagating region, where H is the film thickness of the thin film, and λ is the wavelength of operating center frequency of the surface acoustic wave.

Even in this case, the exciting or receiving region may have an interdigital electrode for exciting or receiving the piezoelectric leaky surface wave formed at an interface between the surface of the substrate and the thin film; and the propagating region may have a structure for electrically shorting between the substrate and the thin film or a shorting type grating electrode structure formed at an interface between the surface of the substrate and the thin film. With the structure set forth above, the electromechanical coupling coefficient $k^2$ becomes large in the exciting or receiving region and the temperature coefficient of frequency (TCF) becomes small in the propagating region.

In addition, by setting H/λ within a preferred range in the exciting or receiving region and in the propagating region, it becomes possible to obtain a surface acoustic wave functional element in which the electromechanical coupling coefficient $k^2$ of the piezoelectric leaky surface wave is greater than or equal to 0.155 in the exciting or receiving region, and the temperature coefficient of frequency (TCF) as measured at 25° C. is in a range from −30 ppm/° C. to +30 ppm/° C. in the propagating region.

In the surface acoustic wave functional element as set forth above, the interdigital electrode is preferably made of one metal selected from the group consisting of Al, Cu, Ti, W, Mo, Cr, Au and Ag or a combination or alloy of two or more metals thereof, and the propagating region is preferably provided with a conductive layer made of one metal selected from the group consisting of Al, Cu, Ti, W, Mo, Cr, Au and Ag or a combination or alloy of two or more metals thereof, as the structure for electrically shorting between the substrate and the thin film.

Accordingly, by employing any one of the surface acoustic wave functional elements as filter, wide band frequency characteristics and low insertion loss can be achieved.

BRIEF DESCRIPTION OF THE DRAWINGS

The present invention will be understood more fully from the detailed description given hereinafter and from the accompanying drawings of the preferred embodiment of the present invention, which, however, should not be taken to be limitative to the invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessary obscurity of the present invention.

Figure 1:
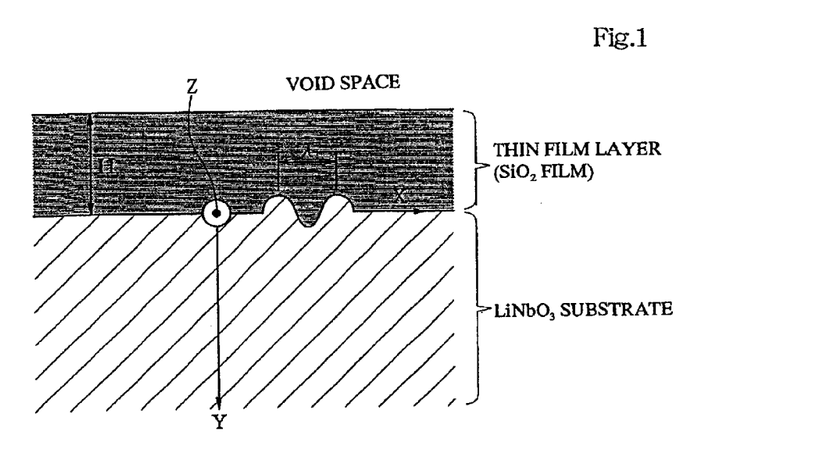
FIG. 1 is a section showing a structure of a surface acoustic wave substrate according to one embodiment of the present invention.

FIG. 1 is a section showing a structure of a surface acoustic wave substrate according to one embodiment of the present invention.

In a monocrystal of LiNbO$_3$ as anisotropic piezoelectric material grown from a seed crystal of X-axis, it is considered a case where Y-axis is taken as 0° and surface acoustic waves propagate along X-axis direction or within a range of ±5° with respect to the X-axis direction in a cut plane of a predetermined rotated Y-plate taking Y-axis as reference.

Analysis and experiment of the LiNbO$_3$ substrate propagating surface acoustic waves on the rotated Y-cut plane along X-axis direction has been reported in Yamanouchi and Shibayama, "Propagation and Amplification of Rayleigh Waves and Piezoelectric Leaky Surface Waves in LiNbO$_3$," Journal of Applied Physics, Vol. 43, No. 3, March, 1972, pp. 856 to 862.

In LiNbO$_3$ substrate, acoustic waves of transverse waves propagating along X-axis direction contain a high velocity transverse wave and a low velocity transverse wave. In the foregoing publication, a wave having a velocity lower than the lower velocity transverse wave is a Rayleigh wave. Most of the surface acoustic waves employed in the conventional filter and the like are Rayleigh waves. The foregoing publication also reports that there is a piezoelectric leaky surface wave having a velocity higher than the velocity of the Rayleigh wave and also higher than the velocity of the lower velocity transverse wave and lower than the velocity of the higher velocity transverse wave.

The piezoelectric leaky surface wave causes propagation attenuation due to the radiation into the substrate. In case of monocrystal of LiNbO$_3$, in a cut plane having the rotation angle of about 41° as rotated from a cut plane of 0° taking the Y-cut plane of the rotated Y plate of monocrystal as 0°, propagation attenuation becomes substantially zero for an OPEN surface. On the other hand, the foregoing publication reports that when a cut plane is electrically shorted by arranging a conductive layer on the LiNbO$_3$ substrate, the propagation attenuation becomes zero for a cut plane having the rotation angle of about 64°; but the propagation attenuation becomes large for cut planes having other rotation angles.

It should be noted that the wording "propagation attenuation" means the attenuation of the piezoelectric leaky surface wave in the course of propagation along the surface of the substrate due to radiation of a part of energy of the piezoelectric leaky surface wave into the substrate. The propagation attenuation is expressed by an attenuation amount (dB) of amplitude of the wave per a unit wavelength (λ), and unit is (dB/λ). When the cut angle of the rotated Y plate is in a range from −10° to +30°, there is a region where the propagation attenuation becomes as large as 0.8 (dB/λ). In such region, it is difficult to use as piezoelectric leaky surface wave substrate.

According to the foregoing publication, moreover, for the rotate Y plate having the cut angle in a range from −10° to +30°, the temperature coefficient of frequency (TCF) at 25° C. becomes as large as −80 ppm/° C.

The temperature coefficient of frequency (TCF) can be expressed by $\{1/v \cdot (\partial v/\partial T) - \alpha\}(1/° C.)$ assuming a propagation velocity of the surface acoustic wave at 25° C. being v (m/s), a variation amount of the propagation velocity relative to temperature variation being $(\partial v/\partial T)$, and a linear expansion coefficient being α.

In the surface acoustic wave substrate of the embodiment shown in FIG. 1, therefore, on the surface of the LiNbO$_3$ substrate, a SiO$_2$ film is formed as a thin film having variation characteristics of frequency of the surface acoustic wave relative to temperature variation opposite to that of the LiNbO$_3$ substrate. Namely, by depositing a fused quartz on the LiNbO$_3$ substrate as monocrystalline piezoelectric material by way of vapor deposition, sputtering method or the like, the thin SiO$_2$ film is formed.

Here, "variation characteristics of frequency of the surface acoustic wave relative to temperature variation opposite to that of the LiNbO$_3$ substrate" means that the operating center frequency becomes lower for the LiNbO$_3$ substrate as the temperature of the LiNbO$_3$ substrate is elevated, whereas the operating center frequency becomes higher for the SiO$_2$ as the temperature of the SiO$_2$ is elevated. Namely, in case of the LiNbO$_3$ substrate, as the temperature is elevated, the propagation velocity of the surface acoustic wave becomes lower, and conjunction therewith, the wavelength becomes longer since the linear expansion coefficient is positive, resulting in lowering the operating center frequency. On the other hand, in case of the SiO$_2$ whose linear expansion coefficient is substantially zero, the propagation velocity becomes higher as the temperature is elevated, so that the wavelength becomes shorter to make the operating center frequency higher.

The shown embodiment has been worked out by noting the fact that the temperature coefficient of frequency (TCF) can be made zero or quite small (see FIG. 9) by forming the thin SiO$_2$ film (which has variation characteristics of frequency of the surface acoustic wave relative to temperature variation opposite to that of the LiNbO$_3$ substrate) on the cut plane of the LiNbO$_3$ substrate, as set forth above. It is also noted that the propagation attenuation can be reduced (see FIG. 4) by electrically shorting between the LiNbO$_3$ substrate and the thin SiO$_2$ film, more particularly, by forming interdigital electrodes 3a and 3b, a structure electrically shorting a propagation path or a shorting type grating electrodes 4 and 4 on an interface between the substrate and the thin film, as shown in FIG. 11.

Here, electrically shorting between the substrate and the thin film means that a conductive layer of uniform film thickness and a given area is formed between the substrate and the thin film. In the alternative, it means that the interdigital electrodes 3a and 3b or the shorting type grating electrodes 4 and 4 are formed between the substrate and the thin film.

In this disclosure, the interdigital electrode is an electrode, in which respective one ends of a plurality of elongated electrodes (strip electrodes) extending in a direction perpendicular to the propagating direction (X-axis direction) of the surface acoustic wave are electrically connected alternately. More particularly, in an exciting or receiving region 5, respective strip electrodes of the interdigital electrode 3a and respective strip electrodes of the interdigital electrode 3b are arranged alternately, as shown in FIG. 11.

Figure 11:
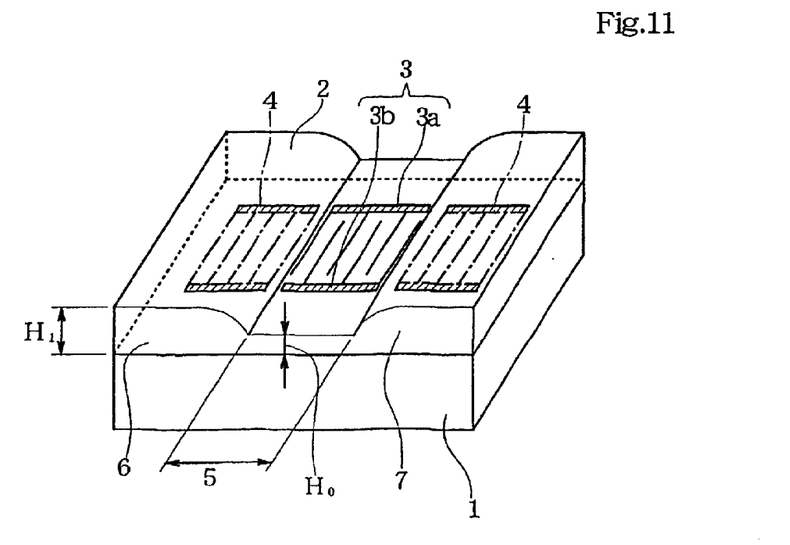
FIG. 11 is a perspective view showing a surface acoustic wave functional element according to one embodiment of the present invention.

On the other hand, as shown in FIG. 11, the shorting type grating electrode is an electrode, in which both ends of a plurality of elongated electrodes (strip electrodes) extending in a direction perpendicular to the propagating direction (X-axis direction) of the surface acoustic wave are shorted with each other. In the piezoelectric leaky surface wave functional element shown in FIG. 11, reflector is formed by the shorting type grating electrodes 4 and 4 formed in propagating regions.

Figure 3:
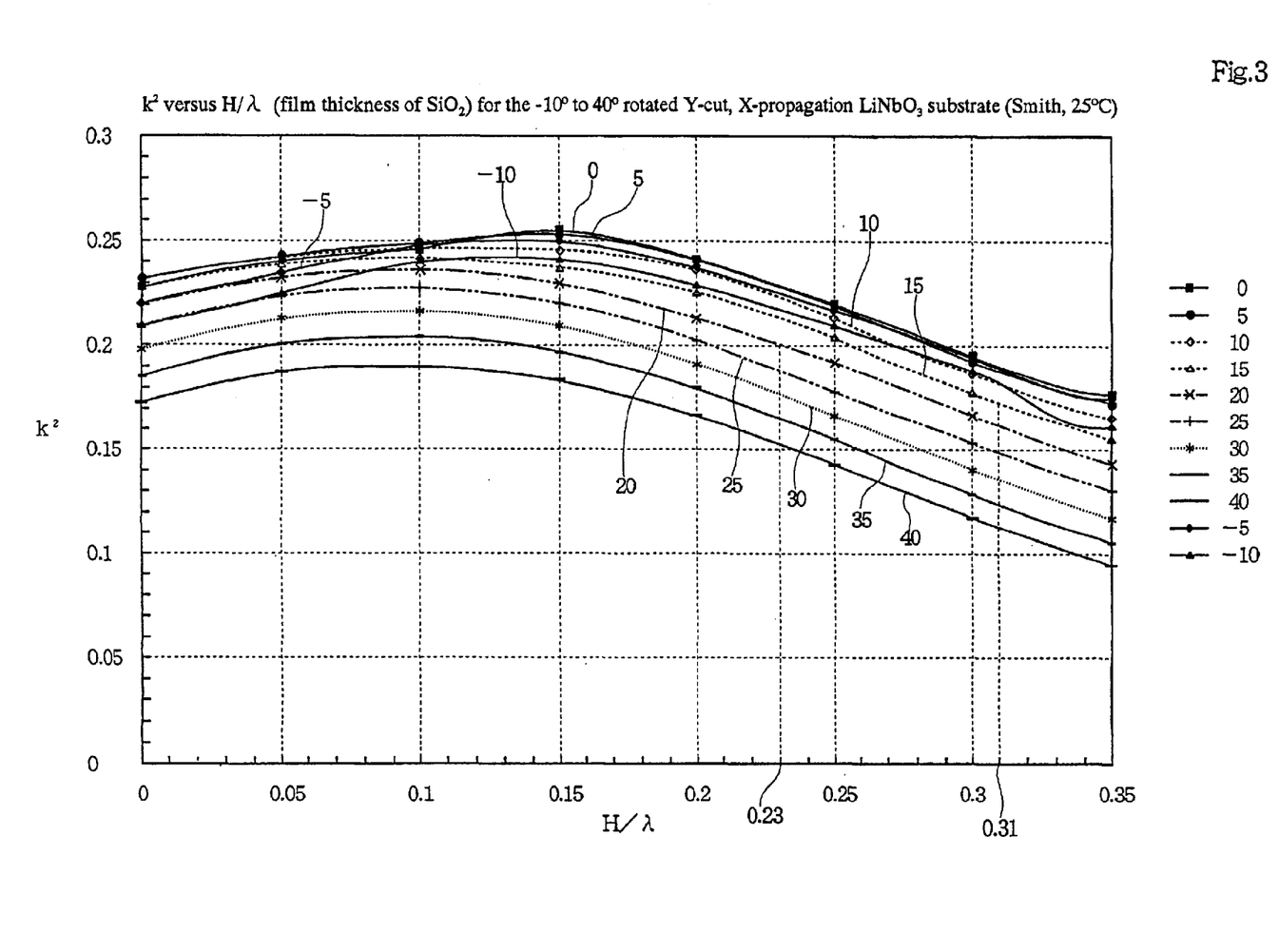
FIG. 3 is an illustration showing a relationship between H/λ and electromechanical coupling coefficient $k^2$ of piezoelectric leaky surface wave when cut angle of rotated Y plate is in a range from 0° to +40°.

Moreover, the shown embodiment has been worked out by noting the fact that by selecting the rotation angle of the rotated Y-cut plane and H/λ (wherein H is a film thickness of the thin SiO$_2$ film and λ is an operating center frequency), the electromechanical coupling coefficient $k_R^2$ of the Rayleigh wave can be set at zero or a value close to zero (FIG. 8) and the electromechanical coupling coefficient $k^2$ of the piezoelectric leaky surface wave can be made large (FIG. 3). Such surface acoustic wave substrate can enhance excitation of the piezoelectric leaky surface wave while exciting little Rayleigh wave, so that it becomes suitable for application for filter having wide band characteristics as well as superior spurious characteristics.

The foregoing characteristics can be obtained by employing the $LiNbO_3$ substrate, in which the rotation angle of the rotated Y plate is greater than or equal to $-10°$ and smaller than or equal to $+30°$ taking the Y-axis direction of the rotated monocrystalline Y plate as the $0°$ cut plane and $H/\lambda$ is set within a range of 0.05 to 0.35. Preferably, the rotation angle of the rotate Y plate is greater than or equal to $0°$ and smaller than or equal to $+20°$ and $H/\lambda$ is within a range of 0.1 to 0.35. In the alternative, when the rotation angle of the rotated Y plate is greater than or equal to $+20°$ and smaller than or equal to $+30°$, $H/\lambda$ is preferably set within a range of 0.15 to 0.35. In either case, the upper limit of $H/\lambda$ is preferably 0.31 for making the electromechanical coupling coefficient $k^2$ higher and the electromechanical coupling coefficient $k_R^2$ of the Rayleigh wave lower.

Figure 4:
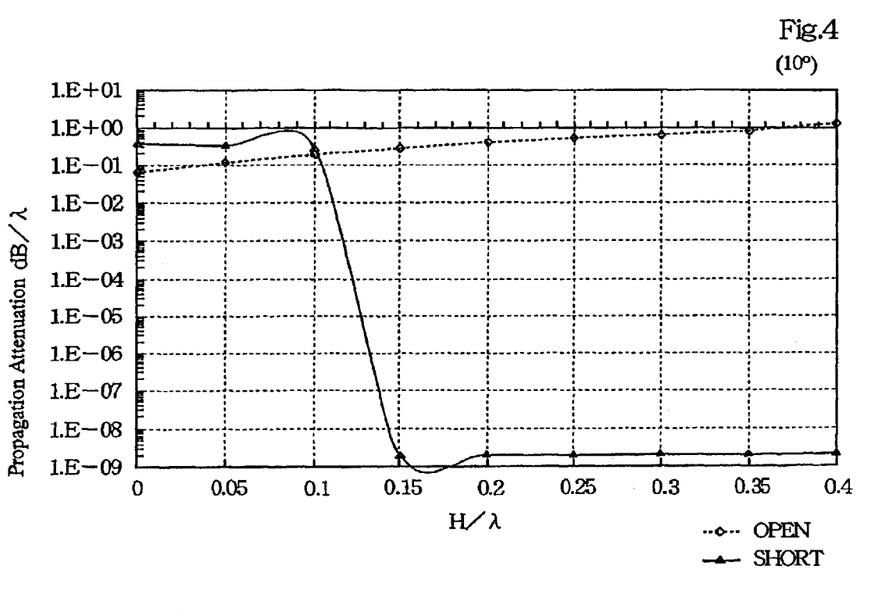
FIG. 4 is an illustration showing a relationship between H/λ and propagation attenuation of piezoelectric leaky surface wave when cut angle of rotated Y plate is +10°.
Figure 9:
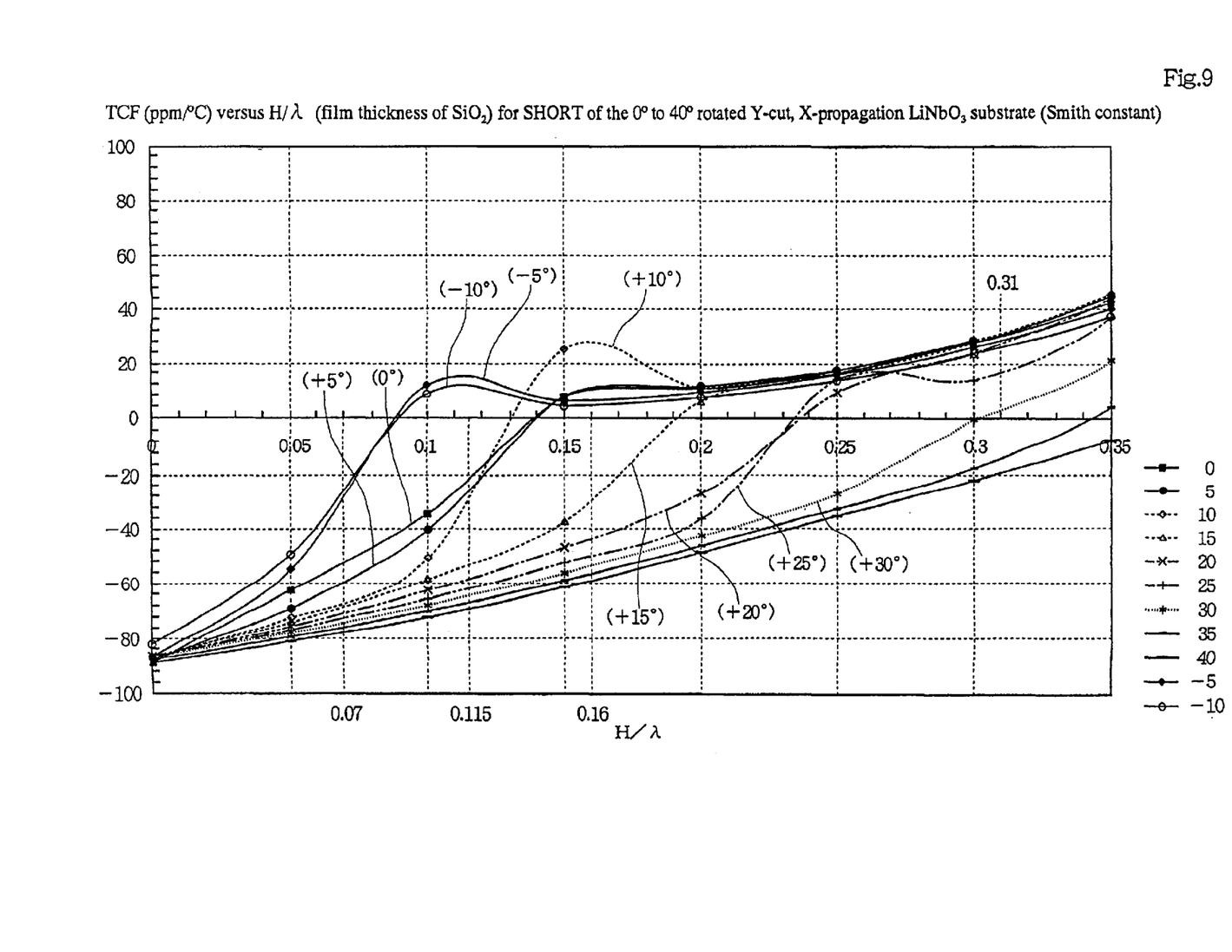
FIG. 9 is an illustration showing an analysis result of H/λ and temperature coefficient of frequency (TCF) of piezoelectric leaky surface wave when cut angle of rotated Y plate is in a range from −10° to +40°.

As an example of detailed characteristics, discussion will be given for the case where the rotation angle is $+10°$. When $H/\lambda=0$, TCF becomes $-80$ ppm/$°$ C., as shown in FIG. 9, and the propagation attenuation becomes 0.8 dB/$\lambda$ in both cases of a short-circuit interface (SHORT), in which the interface between the substrate and the thin film is electrically shorted, and an open-circuit interface (OPEN), in which the interface between the substrate and the thin film is not shorted, as shown in FIG. 4, so that good characteristics cannot be obtained. When $H/\lambda=0.2$, on the other hand, TCF becomes a value close to 0 ppm/$°$ C. for the short-circuit interface (SHORT), as shown in FIG. 9. When $H/\lambda=0.2$, moreover, the piezoelectric leaky surface wave substrate, in which the propagation attenuation is substantially 0 dB/$\lambda$ for the short-circuit interface (SHORT), can be obtained, as shown in FIG. 4.

Here, when the interdigital electrode for exciting or receiving the surface acoustic wave is provided at the interface between the substrate and the thin film, or when the shorting type grating electrode is provided in the surface acoustic wave propagation path, it corresponds to a condition of the short-circuit interface (SHORT), so that the propagation attenuation of the piezoelectric leaky surface wave propagating on the electrode can be made zero or close to zero.

The electrode is formed from a metal film of aluminum (Al), copper (Cu), titanium (Ti), tungsten (W), molybdenum (Mo), chromium (Cr), gold (Au) or silver (Ag), or a metal film or alloy of two or more of the foregoing metals. Preferably, the exciting electrode or receiving electrode is made of Al or Cu, and the electrode, such as reflector, located within the propagating region is made of Al or Cu. When the electrode is made of Cu, the insertion loss can be reduced. When the electrode is made of a combination of metals, such as Al and Ti, the occurrence of fatigue failure on the electrode when larger power is provided can be prevented.

As the elastic constant, piezoelectric constant and dielectric constant of $LiNbO_3$, the constants measured by Smith et al. (R. T. Smith et al., "Temperature Dependence of the Elastic Piezoelectric, and Dielectric Constants of Lithium Tantalate and Lithium Niobate", Journal of Applied Physics Vol. 42, No. 6, May 1971, pp. 2219 to 2229), and the constants measured by Warner et al. (A. W. Warner et al. "Determination of Elastic and Piezoelectric Constants for Crystals in Class (3m)", The Journal of the Acoustical Society of America, Vol. 42, No. 6, 1967, pp. 1223 to 1231) have been known. Concerning the temperature characteristics, the constant measured by Smith et al. has been known (the constants and temperature characteristics of $SiO_2$ were measured by M. J. Mcskimin, J. Appl. Phys., Vol. 24, pp. 988 to 997, 1953). Analysis was performed for $LiNbO_3$, with the constants of Smith and Warner and the constant of temperature characteristics of Smith (for $SiO_2$, with the constants of Mcskimin). Since the result of experiments concerning $LiNbO_3$ was closer to the constants of Smith et al., the result of calculation using the constants of Smith will be discussed together with the result of experiments.

Figure 2:
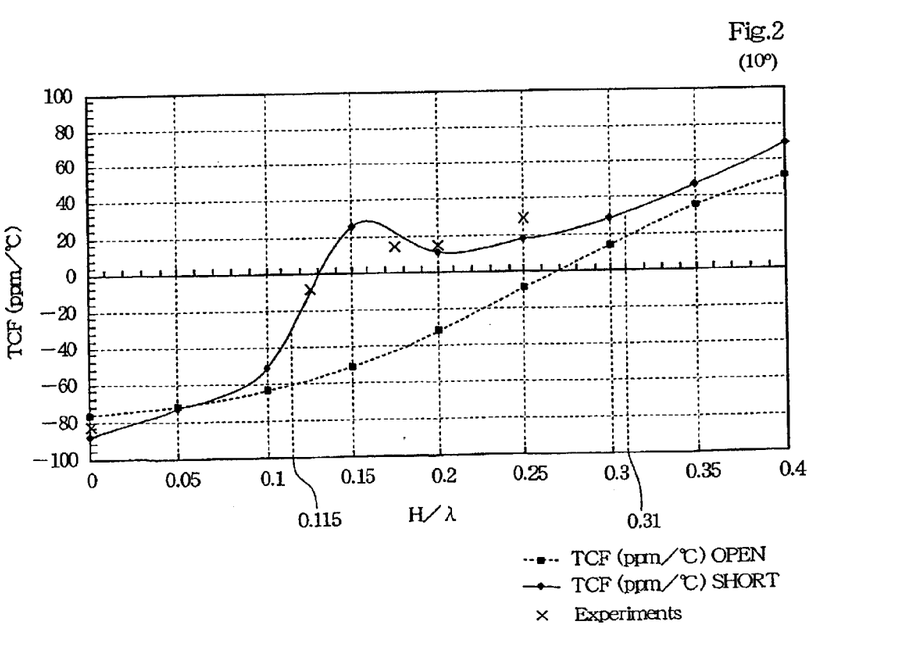
FIG. 2 is an illustration showing a relationship between H/λ and temperature coefficient of frequency (TCF) when cut angle of rotated Y plate is +10°.
Figure 5:
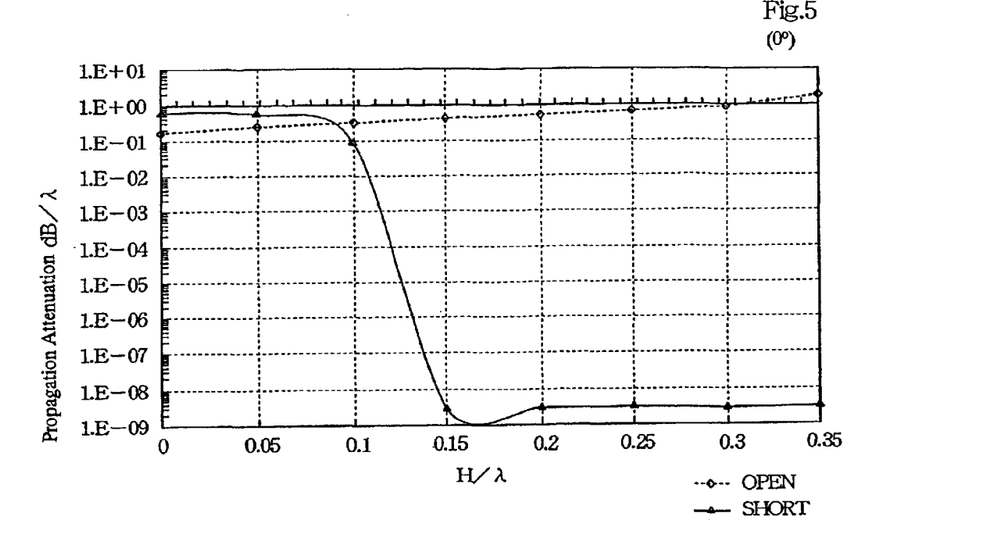
FIG. 5 is an illustration showing a relationship between H/λ and propagation attenuation of piezoelectric leaky surface wave when cut angle of rotated Y plate is 0°.
Figure 6:
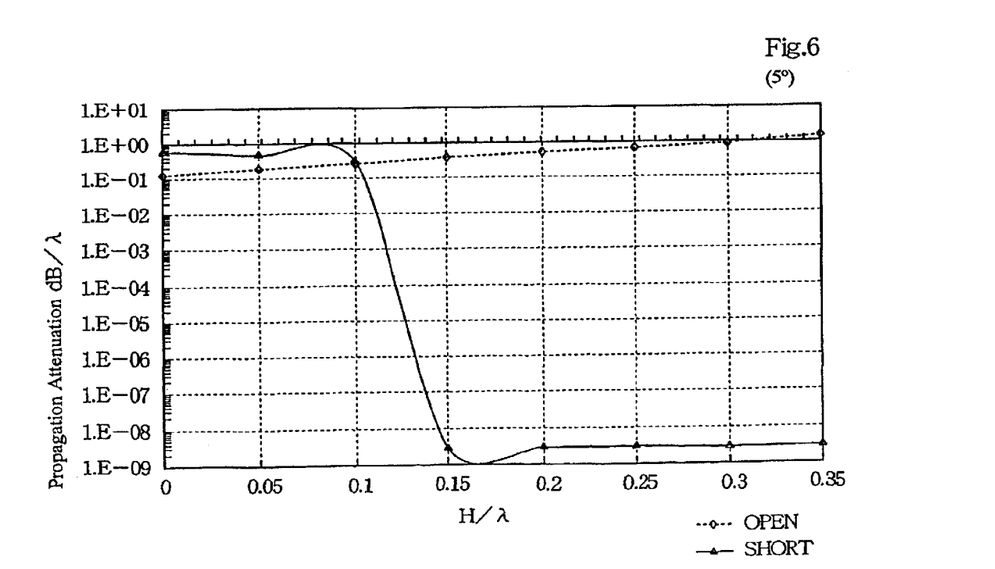
FIG. 6 is an illustration showing a relationship between H/λ and propagation attenuation of piezoelectric leaky surface wave when cut angle of rotated Y plate is +5°.
Figure 7:
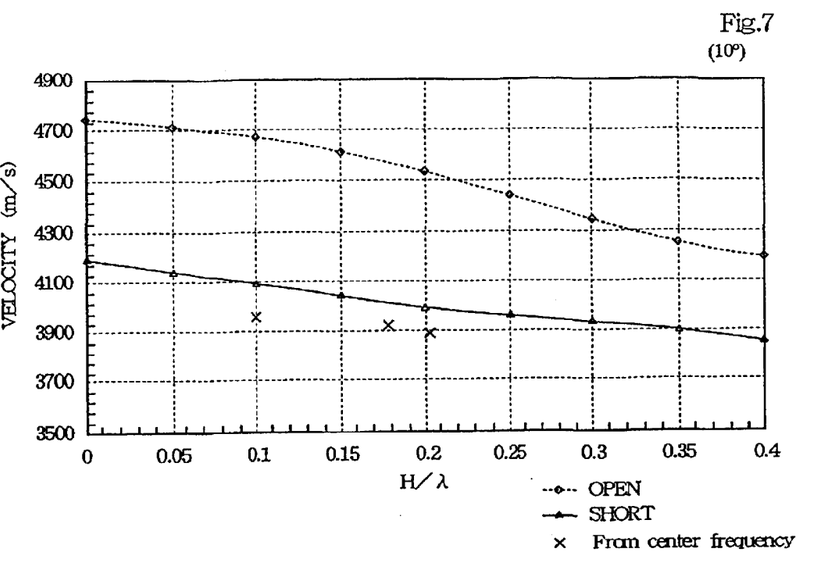
FIG. 7 is an illustration showing a relationship between H/λ and propagation velocity when cut angle of rotated Y plate is 10°.
Figure 8:
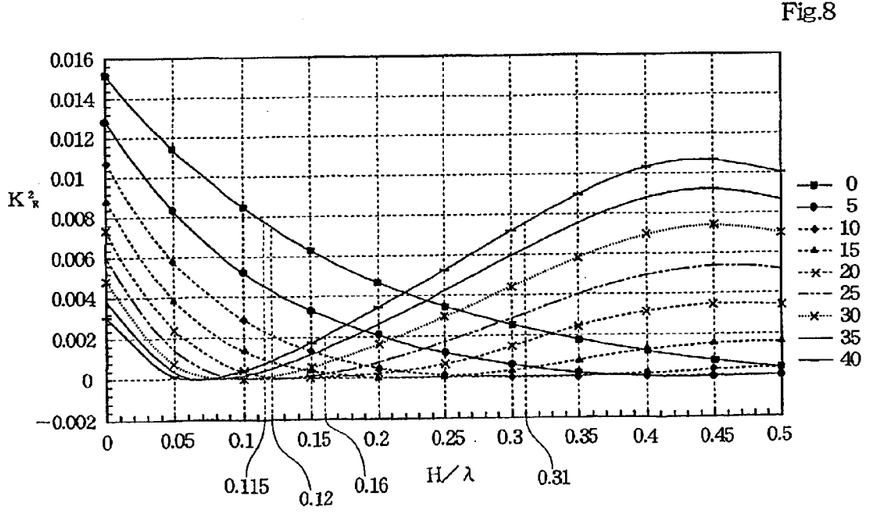
FIG. 8 is an illustration showing a relationship between Rayleigh wave component and electromechanical coupling coefficient $k_R^2$ when cut angle of rotated Y plate is in a range from 0° to +40°.

FIG. 2 is an illustration showing a relationship between $H/\lambda$ and the temperature coefficient of frequency (TCF), FIG. 3 is an illustration showing a relationship between $H/\lambda$ and the electromechanical coupling coefficient $k^2$ of the piezoelectric leaky surface wave, FIGS. 4, 5 and 6 are illustrations showing a relationship between $H/\lambda$ and the propagation attenuation of the piezoelectric leaky surface wave, FIG. 7 is an illustration showing a relationship between $H/\lambda$ and the propagation velocity of the surface acoustic wave, and FIG. 8 is an illustration showing a relationship between $H/\lambda$ and the electromechanical coupling coefficient $k_R^2$ of Rayleigh wave component which has a propagation velocity lower than that of the piezoelectric leaky surface wave. It should be noted that FIGS. 2, 4 and 7 show the case where the rotation angle of the rotated Y plate of $LiNbO_3$ substrate is $+10°$, FIG. 5 shows the case where the rotation angle is $0°$, FIG. 6 shows the case where the rotation angle is $+5°$, and FIGS. 3 and 8 show the cases where the rotation angles are varied per $5°$ within a range from $0°$ to $40°$. In either case, the propagating direction of the surface acoustic wave is the X-axis direction.

Curves of solid line and broken line in FIG. 2 show the results calculated by using the constants of Smith. When the rotation angle of the rotated Y plate is $10°$, TCF $-0$ ppm/$°$ C. is established at $H/\lambda=0.13$ for the short-circuit interface (SHORT) in which the surface of the substrate is electrically shorted at the interface between the $LiNbO_3$ substrate and the thin $SiO_2$ film, and at $H/\lambda=0.26$ for the open-circuit interface (OPEN) in which the surface of the substrate is not shorted. A velocity derived from a center frequency when the surface acoustic wave is transmitted and received by the interdigital electrode formed on the interface between the $LiNbO_3$ substrate and the thin $SiO_2$ film, is shown by "X". From this, it can be appreciated that the interdigital electrode is in operation as shorting electrode. This result of experiments is appreciated as matching with the result of calculation.

From FIG. 2, it is seen that when the rotation angle of the rotated Y plate is $+10°$ and the interface is shorted, the temperature coefficient of frequency (TCF) becomes 0 at $H/\lambda=0.13$. When $H/\lambda$ is in a range greater than or equal to 0.115 and smaller than or equal to 0.31, on the other hand, there can be obtained a piezoelectric leaky surface wave substrate in which the temperature coefficient of frequency (TCF) is in a range of $-30$ ppm/$°$ C. to $+30$ ppm/$°$ C.

As shown in FIG. 3, the electromechanical coupling coefficient $k^2$ of the piezoelectric leaky surface wave becomes as large as 0.24 or greater when the rotation angle is $+10°$ and $H/\lambda$ is 0.13 for the short-circuit interface, i.e., when the temperature coefficient of frequency (TCF) is 0. On the other hand, when $H/\lambda$ is in a range greater than or equal to 0.115 and smaller than or equal to 0.31, $k^2$ can be greater than or equal to 0.19.

FIG. 4 shows the propagation attenuation (Decay) when the rotation angle is +10°. In case of the short-circuit interface (SHORT), it is seen that the propagation attenuation becomes quite close to zero at H/λ=0.13, and the propagation attenuation can be made at small value even when H/λ is in a range greater than or equal to 0.115 and smaller than or equal to 0.31. It should be noted that, in case of the open-circuit interface (OPEN), the propagation attenuation is about 0.8 dB/λ at H/λ=0.26 where the temperature coefficient of frequency (TCF) becomes zero. Thus, the propagation attenuation becomes quite large.

Accordingly, in case where the substrate is electrically shorted at the interface between the $LiNbO_3$ substrate and the thin $SiO_2$ film by providing the interdigital electrode for excitation and reception, the shorting electrode, or the shorting type grating electrode for forming reflector at the interface between the $LiNbO_3$ substrate and the thin $SiO_2$ film, a surface acoustic wave functional element such as filter, in which the temperature coefficient of frequency is excellent, the electromechanical coupling coefficient $k^2$ is large, and the propagation attenuation is close to zero, can be obtained by setting the rotation angle of the rotated Y plate of the substrate at +10° and H/λ greater than or equal to 0.115 and smaller than or equal to 0.31. On the other hand, by setting H/λ greater than or equal to 0.15 and smaller than or equal to 0.25, the electromechanical coupling coefficient $k^2$ can be made greater than or equal to 0.215 and the propagation attenuation can be made as close as 0.

In case of the short-circuit interface (SHORT), width of variation of the propagation velocity of the surface acoustic wave relative to variation of H/λ is small, as shown in FIG. 7, and therefore, the short-circuit interface is appreciated as practically effective. In FIG. 7, mark "x" represents the experimentally derived value of the velocity of the piezoelectric leaky surface wave excited by the interdigital electrode which is provided at the interface between the $LiNbO_3$ substrate and the thin $SiO_2$ film. As can be appreciated, the experimental value is approximated with the result calculated from the constants of Smith et al. for the short-circuit interface (SHORT).

On the other hand, as shown in FIG. 8, in case where the rotation angle of the cut plane of the rotated Y plate is +10°, the electromechanical coupling coefficient $K_R^2$ of the Rayleigh wave falls within a range of +0.002 to 0 when the value of H/λ is in a range of 0.115 to 0.31, so that there can be obtained a surface acoustic wave substrate having little spurious signal.

FIG. 9 is an illustration showing a result of analysis of H/λ and the temperature coefficient of frequency (TCF) of the piezoelectric leaky surface wave, for the short-circuit interface (SHORT), wherein the rotation angle of the rotated Y plate, which is rotated per 5° within a range from −10° to 40°, is taken as parameter.

As shown in FIG. 9, within a range of rotation angle from −10° to +15°, it can be appreciated that the temperature coefficient of frequency for the short-circuit interface can be zero (TCF=0 ppm/° C.) at H/λ being greater than or equal to 0.05 and smaller than or equal to 0.2. Within a range of rotation angle from −10° to +25°, it can be appreciated that the temperature coefficient of frequency can be zero at H/λ being greater than or equal to 0.05 and smaller than or equal to 0.25. Furthermore, within a range of rotation angle from −10° to +30°, it can be appreciated that the temperature coefficient of frequency can be zero at H/λ being greater than or equal to 0.05 and smaller than or equal to 0.35.

As set forth above, it can be appreciated that due to acoustic characteristics depending upon variation of the film thickness H of the thin $SiO_2$ film, the optimal rotation angle of the cut plane of the rotated Y plate of the $LiNbO_3$ substrate can vary. Therefore, the intended surface acoustic wave functional element can be fabricated by selecting and combining the optimal rotation angle and film thickness H of the thin $SiO_2$ film.

In case where electrical shorting is caused between the substrate and the thin film at the interface between the substrate and the thin film by forming the interdigital electrode, the shorting electrode, or the shorting type grating electrode at the interface between the $LiNbO_3$ substrate and the $SiO_2$ film, as set forth above, the following relationship between the rotation angle of the rotated Y plate of the substrate and H/λ is required to be set for obtaining the temperature coefficient of frequency (TCF) in a range greater than or equal to −30 ppm/° C. and smaller than or equal to +30 ppm/° C., as shown in FIG. 9:

(1) when cut angle of the rotated Y plate is in a range greater than or equal to −10° and smaller than or equal to −5°, H/λ is in a range greater than or equal to 0.07 and smaller than or equal to 0.31;

(2) when cut angle of the rotated Y plate is in a range greater than or equal to −5° and smaller than or equal to +10°, H/λ is in a range greater than or equal to 0.115 and smaller than or equal to 0.31;

(3) when cut angle of the rotated Y plate is in a range greater than or equal to +10° and smaller than or equal to +15°, H/λ is in a range greater than or equal to 0.16 and smaller than or equal to 0.31;

(4) when cut angle of the rotated Y plate is in a range greater than or equal to +15° and smaller than or equal to +20°, H/λ is in a range greater than or equal to 0.2 and smaller than or equal to 0.31; and (5) when cut angle of the rotated Y plate is in a range greater than or equal to +20° and smaller than or equal to +30°, H/λ is in a range greater than or equal to 0.25 and smaller than or equal to 0.31.

Furthermore, when rotation angle is in a range greater than or equal to 0° and smaller than or equal to +10°, the optimal range of H/λ is greater than or equal to 0.115 and smaller than or equal to 0.31, too, and when rotation angle is in a range greater than or equal to +5° and smaller than or equal to +15°, the optimal range of H/λ is greater than or equal to 0.16 and smaller than or equal to 0.31, too.

FIGS. 4, 5 and 6 show the cases where the rotation angles are +10°, 0° and +5°, and it is seen that conditions to make the propagation attenuation close to zero for the short-circuit interface do not depend on rotation angle of the rotated Y plate but depend on H/λ. With FIGS. 4, 5 and 6, it can be appreciated that, among the ranges shown in (1), (2), (3), (4) and (5), if H/λ is greater than or equal to 0.115, the propagation attenuation can be reduced, and if H/λ is greater than or equal to 0.16, the propagation attenuation becomes as close as zero. Therefore, for making the propagation attenuation becomes close to zero, H/λ is preferably greater than or equal to 0.13 even in (1) and (2), and is further preferably greater than or equal to 0.15.

On the other hand, as shown in FIG. 8, when H/λ is in a range greater than or equal to 0.16 and smaller than or equal to 0.31, the electromechanical coupling coefficient $k_R^2$ of the Rayleigh wave becomes smaller than 0.01, so that the substrate hardly excites Rayleigh wave components and is excellent in spurious characteristics. FIG. 8 shows that, as the rotation angle of the rotated Y plate becomes smaller, the value of H/λ making $k_R^2$ zero becomes higher. Therefore, in case of (1) or (2), or in case where the rotation angle is in a range from 0° to +5°, H/λ is preferably greater than or equal to 0.15, and is further preferably greater than or equal to 0.2.

On the other hand, as shown in FIG. 3, when the rotation angle of the rotated Y plate is greater than or equal to −10° and smaller than or equal to +30°, the electromechanical coupling coefficient $k^2$ of the piezoelectric leaky surface wave can be greater than or equal to 0.135 by making H/λ smaller than or equal to 0.31. When the rotation angle of the rotated Y plate is smaller than or equal to +20°, the electromechanical coupling coefficient $k^2$ of the piezoelectric leaky surface wave can be greater than or equal to 0.155 by making H/λ smaller than or equal to 0.31. When the rotation angle of the rotated Y plate is smaller than or equal to +15°, the electromechanical coupling coefficient $k^2$ of the piezoelectric leaky surface wave can be greater than or equal to 0.175 by making H/λ smaller than or equal to 0.31.

On the other hand, in order to improve propagation characteristics of the piezoelectric leaky surface wave by reducing insertion loss to make output higher, it is preferred to make the electromechanical coupling coefficient $k^2$ greater than or equal to 0.215. For this purpose, in case of foregoing (1), it is preferred that H/λ is greater than or equal to 0.07 and smaller than or equal to 0.25, in case of foregoing (2), it is preferred that H/λ is greater than or equal to 0.115 and smaller than or equal to 0.25, and in case of the foregoing (3), it is preferred that H/λ is greater than or equal to 0.16 and smaller than or equal to 0.23.

Typically, the propagation attenuation of the surface acoustic wave in the thin film layer, such as $SiO_2$ film or the like is considered to be greater than that of the $LiNbO_3$ substrate as monocrystalline piezoelectric material. On the other hand, in the embodiment, by setting H/λ within the foregoing range while taking the temperature coefficient of frequency (TCF) into account, the film thickness H of the $SiO_2$ film becomes as small as 1 μm at the wavelength grater than or equal to 5 μm (frequency: 800 MHz) to make the propagation attenuation in the thin film quite small. As set forth above, formation of the thin film can be done to form high quality film at high precision as already used in semiconductor fabrication technology.

Figure 10:
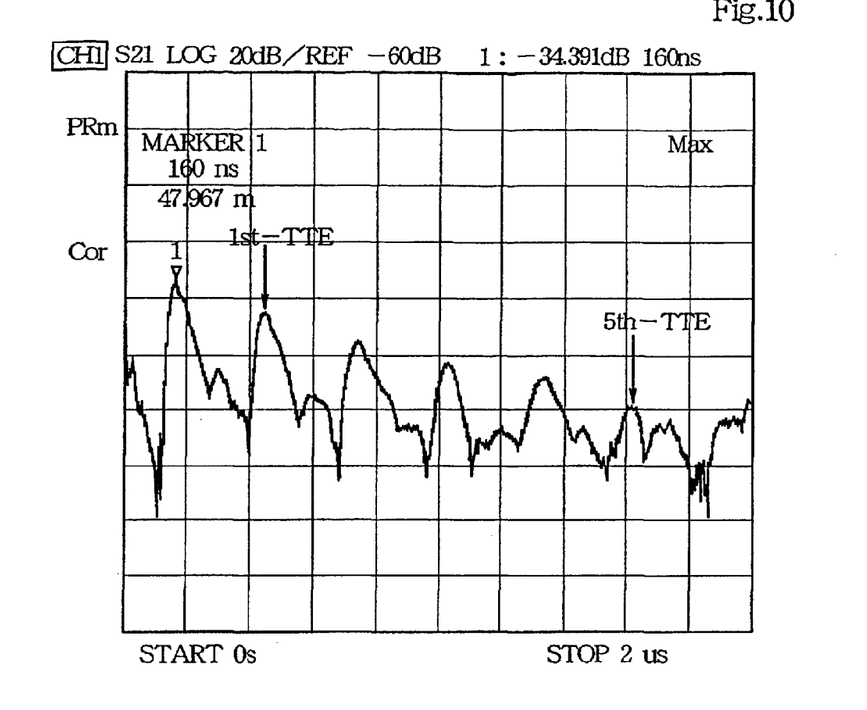
FIG. 10 is an illustration showing a result of experiments showing that fifth triple transit echo (TTE) is observed in a film thickness to obtain zero temperature coefficient in propagation distance 60λ, λ=5 μm (about 400 MHz)

FIG. 10 is an illustration showing a result of experiments of TTE (Triple Transit Echo). FIG. 10 shows the case where the rotation angle of the rotated Y plate is set at +10°, the film thickness of the thin film layer is set at H/λ=0.13 to achieve zero temperature coefficient of frequency (TCF=0), and the propagation distance is set at 60λ (wherein λ=10 μm (about 400 MHz)). It should be noted that TTE represents a phenomenon where the surface wave excited on input side is partly reflected as reaching on reception side and again reflected on the input side.

In FIG. 10, fifth TTE is observed. By this, propagation attenuation is smaller than or equal to 0.01 dB/λ.

From the foregoing, by forming a surface acoustic wave resonator having a reflector satisfying the conditions for the short-circuit interface, for example, a surface acoustic wave resonator achieving high Q value can be obtained.

In the shown embodiment, since the $SiO_2$ film can be made thinner for making the propagation attenuation smaller, it becomes possible to form a piezoelectric leaky surface wave substrate having the temperature coefficient of frequency close to zero and large electromechanical coupling coefficient $k^2$. Accordingly, the piezoelectric leaky surface wave functional element, such as wide band filter, matched filter, VCO and so forth, having superior temperature coefficient of frequency which had not been able to be achieved in the prior art, can be obtained.

FIG. 11 is a perspective view showing one example of the surface acoustic wave functional element, in which the foregoing piezoelectric leaky surface wave substrates is employed, as one embodiment of the present invention.

In the surface acoustic wave substrate shown in FIG. 11, the thin $SiO_2$ film layer 2 is formed on the surface of the $LiNbO_3$ substrate 1. On the interface between the $LiNbO_3$ substrate 1 and the thin film layer 2, there is formed the interdigital electrode consisted of one electrode 3a and the other electrode 3b for exciting or receiving the piezoelectric leaky surface wave. On left and right sides of the exciting or receiving region 5, propagating regions 6 and 7 formed with a pair of shorting type grating electrodes 4 and 4 serving as reflector, are located.

The film thickness of the thin film layer 2 is different between the exciting or receiving region 5 and the propagating regions 6, 7. In the exciting or receiving region 5, the thin film layer 2 has a film thickness $H_0$ that is set in a range where the electromechanical coupling coefficient $k^2$ of the piezoelectric leaky surface wave becomes large; and in the propagating regions 6 and 7, the thin film layer 2 has a film thickness $H_1$ that is set so as to make the temperature coefficient of frequency (TCF) small. As a result, it becomes possible to obtain the surface acoustic wave functional element having large electromechanical coupling coefficient for the piezoelectric leaky surface wave and superior temperature coefficient of frequency. In this case, the following combinations of the film thicknesses $H_0$ and $H_1$ are preferred:

(6) when cut angle of the rotated Y plate of the substrate is in a range greater than or equal to −10° and smaller than or equal to −5°, $H_0/\lambda$ is preferably in a range greater than or equal to 0 and smaller than or equal to 0.25, more preferably in a range greater than or equal to 0.05 and smaller than or equal to 0.25 in the exciting or receiving region 5, and $H_1/\lambda$ is preferably in a range greater than or equal to 0.07 and smaller than or equal to 0.31, more preferably in a range greater than or equal to 0.15 and smaller than or equal to 0.31 in the propagating regions 6 and 7;

(7) when cut angle of the rotated Y plate of the substrate is in a range greater than or equal to −5° and smaller than or equal to +10°, $H_0/\lambda$ is preferably in a range greater than or equal to 0 and smaller than or equal to 0.25, more preferably in a range greater than or equal to 0.05 and smaller than or equal to 0.25 in the exciting or receiving region 5, and $H_1/\lambda$ is preferably in a range greater than or equal to 0.115 and smaller than or equal to 0.31, more preferably in a range greater than or equal to 0.15 and smaller than or equal to 0.25 in the propagating regions 6 and 7;

(8) when cut angle of the rotated Y plate of the substrate is in a range greater than or equal to +10° and smaller than or equal to +15°, $H_0/\lambda$ is preferably in a range greater than or equal to 0 and smaller than or equal to 0.23, more preferably in a range greater than or equal to 0.05 and smaller than or equal to 0.23 in the exciting or receiving region 5, and $H_1/\lambda$ is preferably in a range greater than or equal to 0.16 and smaller than or equal to 0.31, more preferably in a range greater than or equal to 0.16 and smaller than or equal to 0.23 in the propagating regions 6 and 7;

(9) when cut angle of the rotated Y plate of the substrate is in a range greater than or equal to +15° and smaller than or equal to +20°, $H_0/\lambda$ is preferably in a range greater than or equal to 0 and smaller than or equal to 0.2, more preferably in a range greater than or equal to 0.05 and smaller than or equal to 0.2 in the exciting or receiving region 5, and $H_1/\lambda$ is preferably in a range greater than or equal to 0.2 and smaller than or equal to 0.31 in the propagating regions 6 and 7.

By setting as set forth above, the electromechanical coupling coefficient $k^2$ of the piezoelectric leaky surface wave can be greater than or equal to 0.2, and preferably greater than or equal to 0.215 in the exciting or receiving region 5, and the temperature coefficient of frequency at 25° C. can be within a range from −30 ppm/° C. to +30 ppm/° C. in the propagating regions 6 and 7.

In the foregoing $SiO_2/LiNbO_3$ substrate, it becomes possible to form an element having a normal type interdigital electrode formed on the interface between the $SiO_2$ film and the $LiNbO_3$ substrate, an element having a unidirectional converter of multi-phase type, an element having an internal reflection type surface acoustic wave converter formed with a unidirectional interdigital electrode, a resonator employing a shorting type grating electrode, a resonator added a reflector and so forth. These can be elements having large electromechanical coupling coefficient $k^2$ and superior temperature coefficient of frequency at propagation attenuation substantially zero, employing the piezoelectric leaky surface wave.

The surface acoustic wave substrate and the surface acoustic wave element can be employed in a filter having wide band width, low insertion loss and superior temperature stability, high performance surface acoustic wave resonator, acoustic wave functional element, such as VCO, or a combined unit as combined with a high performance semiconductor element.

Although the present invention has been illustrated and described with respect to exemplary embodiment thereof, it should be understood by those skilled in the art that the foregoing and various other changes, omission and additions may be made therein and thereto, without departing from the spirit and scope of the present invention. Therefore, the present invention should not be understood as limited to the specific embodiment set out above but to include all possible embodiments which can be embodied within a scope encompassed and equivalent thereof with respect to the feature set out in the appended claims.

What is claimed is:

1. A surface acoustic wave substrate, comprising:
    a piezoelectric or electrostrictive substrate having large electromechanical coupling coefficient; and
    a thin $SiO_2$ film formed on said substrate and having variation characteristics of frequency of a surface acoustic wave relative temperature variation opposite to that of said substrate,
    wherein said substrate is a $LiNbO_3$ substrate having a cut angle of rotated Y plate within a range greater than or equal to −10° and smaller than or equal to +30° and propagating a piezoelectric leaky surface wave having a propagation velocity higher than that of a Rayleigh type surface acoustic wave along X-axis directon or within a range of ±5° with respect to X-axis direction, and
    a value of $H/\lambda$ falls within a range from 0.05 to 0.35, where H is the film thickness of said thin $SiO_2$ film, and $\lambda$ is the wavelength of operating center frequency of said piezoelectric leaky surface wave.

2. A surface acoustic wave substrate as set forth in claim 1, wherein the cut angle of rotated Y plate of said substrate is in a range greater than or equal to 0° and smaller than or equal to +20°, and the value of h/$\lambda$ falls within a range from 0.1 to 0.35.

3. A surface acoustic wave substrate as set forth in claim 1, wherein the cut angle of rotated Y plate of said substrate is in a range greater than or equal to +20 and smaller than or equal to +30°, and the value of $H/\lambda$ falls within a range from 0.15 to 0.35.

4. A surface acoustic wave substrate as set forth in claim 1, wherein the temperature coefficient of frequency (TCF) as measured at 25° is in a range from −30 ppm/°C. to +30 ppm/°C.

5. A surface acoustic wave substrate as set forth in claim 4, wherein the electromechanical coupling coefficient $k^2$ of said piezoelectric leaky surface wave is greater than or equal to 0.155 and the electromechanical coupling coefficient $k_R^2$ of a Rayleigh wave component is smaller than or equal to 0.01.

6. A surface acoustic wave substrate as set forth in claim 5, wherein the cut angle of rotated Y plate of said substrate is in a range greater than or equal to −10° and smaller than or equal to −5°, and the value of $H/\lambda$ falls within a range from 0.07 to 0.31.

7. A surface acoustic wave substrate as set forth in claim 5, wherein the cut angle of rotated Y plate of said substrate is in a range greater than or equal to −5° and smaller than or equal to +10°, and the value of $H/\lambda$ falls within a range from 0.115 to 0.31.

8. A surface acoustic wave substrate as set forth in claim 5, wherein the cut angle of rotated Y plate of said substrate is in a range greater than or equal to +10° and smaller than or equal to +15°, and the value of h/$\lambda$ falls within a range from 0.16 to 0.31.

9. A surface acoustic wave substrate as set forth in claim 5, wherein the cut angle of rotated Y plate of said substrate is in a range greater than or equal to +15° and smaller than or equal to +20°, and the value of h/$\lambda$ falls within a range from 0.2 to 0.31.

10. A surface acoustic wave substrate as set forth in claim 5, wherein the cut angle of rotated Y plate of said substrate is in a range greater than or equal to +20° and smaller than or equal to +30°, and the value of h/$\lambda$ falls within a range from 0.25 to 0.31.

11. A surface acoustic wave functional element comprising a surface acoustic wave substrate, the surface acoustic wave substrate comprising:
    a piezoelectric or electrostrictive substrate having large electromechanical coupling coefficient; and
    a thin $SiO_2$ film formed on said substrate and having variation characteristics of frequency of a surface acoustic wave relative temperature variation opposite to that of said substrate,
    wherein said substrate is a $LiNbO_3$ substrate having a cut angle of rotated Y plate within a range greater than or equal to −10° and smaller than or equal to +30° and propagating a piezoelectric leaky surface wave having a propagation velocity higher than that of a Rayleigh type surface acoustic wave along X-axis direction or within a range of ±5° with respect to X-axis direction, and
    a value of $H/\lambda$ falls within a range from 0.05 to 0.35, where H is the film thickness of said thin $SiO_2$ film, and $\lambda$ is the wavelength of operating center frequency of said piezoelectric leaky surface wave,
    the element including:
        an exciting or receiving region having an interdigital electrode for exciting or receiving the piezoelectric leaky surface wave formed at an interface between the surface of said substrate and said thin $SiO_2$ film; and a propagating region having a structure for electrically shorting between said substrate and said thin SiO$_2$ film or a shorting type grating electrode formed at an interface between the surface of said substrate and said thin SiO$_2$ film.

12. A surface acoustic wave functional element comprising a substrate including: a piezoelectric or electrostrictive substrate having large electromechanical coupling coefficient; and a thin SiO$_2$ film formed on said substrate and having variation characteristics of frequency of a surface acoustic wave relative temperature variation opposite to that of said substrate, wherein said substrate is a LiNbO$_3$ substrate having a cut angle of rotated Y plate within a range greater than or equal to −10° and smaller than or equal to +30° and propagating a piezoelectric leaky surface wave having a propagation velocity higher than that of a Rayleigh type surface acoustic wave along X-axis direction or within a range of ±5° with respect to X-axis direction, and a value of H/λ falls within a range from 0 to 0.35 in an exciting or receiving region, and within a range from 0.05 to 0.35 in a propagating region, where H is the film thickness of said thin SiO$_2$ film, and λ is the wavelength of operating center frequency of said surface acoustic wave.

13. A surface acoustic wave functional element as set forth in claim 12, wherein said exciting or receiving region has an interdigital electrode for exciting or receiving the piezoelectric leaky surface wave formed at an interface between the surface of said substrate and said thin SiO$_2$ film; and said propagating region has a structure for electrically shorting between said substrate and said thin SiO$_2$ film or a shorting type grating electrode structure formed at an interface between the surface of said substrate and said thin SiO$_2$ film.

14. A surface acoustic wave functional element as set forth in claim 12, wherein the electromechanical coupling coefficient k$^2$ of said piezoelectric leaky surface wave is greater than or equal to 0.155 in said exciting or receiving region, and the temperature coefficient of frequency as measured at 25° C. is in a range from −30 ppm/°C. to +30 ppm/°C. in said propagating region.

15. A surface acoustic wave functional element as set forth in claim 11, wherein said interdigital electrode is made of one metal selected from the group consisting of Al, Cu, Ti, W, Mo, Cr, Au, and Ag, or a combination or alloy of two or more metals thereof.

16. A surface acoustic wave functional element as set forth in claim 11, wherein said propagating region is provided with a conductive layer made of one metal selected from the group consisting of Al, Cu, Ti, W, Mo, Cr, Au, and Ag, or a combination or alloy of two or more metals thereof, as the structure for electrically shorting between said substrate and said thin SiO$_2$ film.

17. A surface acoustic wave function element as set forth in claim 13, wherein said interdigital electrode is made of one metal selected from the group consisting of Al, Cu, Ti, W, Mo, Cr, Au, and Ag, or a combination or alloy of two or more metals thereof.

18. A surface acoustic wave functional element as set forth in claim 13, wherein said propagating region is provided with a conductive layer made of one metal selected from the group consisting of Al, Cu, Ti, W, Mo, Cr, Au, and Ag, or a combination or alloy of two or more metals thereof, as the structure for electrically shorting between said substrate and said thin SiO$_2$ film.

19. A surface acoustic wave functional element as set forth in claim 13, wherein the electromechanical coupling coefficient k$^2$ of said piezoelectric leaky surface wave is greater than or equal to 0.155 in said exciting or receiving region, and the temperature coefficient of frequency as measured at 25° C. is in a range from −30 ppm/°C. to +30 ppm/°C. in said propagating region.

* * * * *